(12) United States Patent
Jeon et al.

(10) Patent No.: US 12,363,213 B2
(45) Date of Patent: Jul. 15, 2025

(54) DISPLAY PANEL HAVING REFLECTIVE COMPENSATION ELECTRODES

(71) Applicant: SAMSUNG DISPLAY CO., LTD., Yongin-si (KR)

(72) Inventors: Joohee Jeon, Hwaseong-si (KR); Sungjin Hong, Seoul (KR); Sang Hoon Kim, Seoul (KR); Taehoon Yang, Yongin-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 459 days.

(21) Appl. No.: 17/076,331

(22) Filed: Oct. 21, 2020

(65) Prior Publication Data
US 2021/0126173 A1    Apr. 29, 2021

(30) Foreign Application Priority Data
Oct. 25, 2019   (KR) .......................... 10-2019-0133468

(51) Int. Cl.
*H10K 59/122*    (2023.01)
*H04M 1/02*    (2006.01)
(Continued)

(52) U.S. Cl.
CPC ....... *H04M 1/0266* (2013.01); *H04M 1/0264* (2013.01); *H10H 20/831* (2025.01);
(Continued)

(58) Field of Classification Search
CPC ........ H01L 27/156; H10K 59/10–1315; H10K 39/34; H04M 1/0202–0287; G06F 1/16–206; G09G 2300/02–0895
See application file for complete search history.

(56) References Cited

U.S. PATENT DOCUMENTS 9,449,551 B2    9/2016  Lee et al.
9,911,941 B2    3/2018  Choi et al.
(Continued)

FOREIGN PATENT DOCUMENTS

KR    10-2014-0117756    10/2014
KR    20160119901    10/2016
(Continued)

*Primary Examiner* — Kevin Parendo
(74) *Attorney, Agent, or Firm* — F. CHAU & ASSOCIATES, LLC

(57) ABSTRACT

An electronic apparatus includes a display panel that includes first electrodes connected to transistors, a second electrode disposed on the first electrodes, a plurality of light emitting patterns each being disposed on a corresponding first electrode, and reflective compensation electrodes spaced apart from the first electrodes. The display panel further includes light emitting areas in which the light emitting patterns are disposed, light transmitting areas in which transmission openings spaced apart from the light emitting patterns are formed through a portion of a circuit element layer and a display element layer, and reflective compensation areas in which the reflective compensation electrodes are disposed. The electronic apparatus includes further includes an electronic module disposed under the display panel and that overlaps the light transmitting areas and is spaced apart from the reflective compensation areas.

20 Claims, 14 Drawing Sheets

(51) Int. Cl.
    *H10H 20/831* (2025.01)
    *H10H 20/832* (2025.01)
    *H10H 20/857* (2025.01)
    *H10H 29/14* (2025.01)
    *H10K 59/12* (2023.01)
    *H10K 59/70* (2023.01)
    *H10K 59/80* (2023.01)

(52) U.S. Cl.
    CPC ........ *H10H 20/835* (2025.01); *H10H 20/857* (2025.01); *H10H 29/142* (2025.01); *H10K 59/122* (2023.02); *H10K 59/12* (2023.02); *H10K 59/70* (2023.02); *H10K 59/8791* (2023.02)

(56) References Cited

U.S. PATENT DOCUMENTS

| | | | |
|---|---|---|---|
| 10,163,990 B2 | 12/2018 | Chung et al. | |
| 10,278,640 B2 | 4/2019 | Chung et al. | |
| 10,840,308 B2 | 11/2020 | Choi | |
| 2004/0245531 A1* | 12/2004 | Fuii | G06F 1/1637 257/88 |
| 2014/0217432 A1* | 8/2014 | Ota | H10K 59/1315 257/89 |
| 2016/0293672 A1 | 10/2016 | Yun et al. | |
| 2017/0371159 A1* | 12/2017 | Yoon | G02B 27/0172 |
| 2018/0145093 A1* | 5/2018 | Xi | H01L 27/1214 |
| 2018/0357952 A1* | 12/2018 | Yang | H10K 59/121 |
| 2019/0214601 A1* | 7/2019 | Park | H10K 50/8445 |
| 2022/0181397 A1* | 6/2022 | Choi | G06F 3/0446 |
| 2022/0302228 A1* | 9/2022 | Choi | H10K 59/121 |

FOREIGN PATENT DOCUMENTS

| | | |
|---|---|---|
| KR | 20160130042 | 11/2016 |
| KR | 20170029041 | 3/2017 |
| KR | 10-2017-0113734 | 10/2017 |
| KRn | 10-2019-0050170 | 5/2019 |

\* cited by examiner

DISPLAY PANEL HAVING REFLECTIVE COMPENSATION ELECTRODES

CROSS-REFERENCE TO RELATED APPLICATION

This U.S. non-provisional patent application claims priority under 35 U.S.C. § 119 from, and the benefit of, Korean Patent Application No. 10-2019-0133468, filed on Oct. 25, 2019 in the Korean Intellectual Property Office, the contents of which are herein incorporated by reference in their entirety.

BACKGROUND

Technical Field

Embodiments of the present disclosure are directed to an electronic apparatus. More particularly, embodiments of the present disclosure are directed to an electronic apparatus that has improved reliability.

Description of the Related Art

An electronic apparatus is activated in response to electrical signals applied thereto. An electronic apparatus includes various electronic components, such as a display module and an electronic module. The display module includes a display panel that displays an image or an input sensing layer that senses an external input. The electronic components are electrically connected to each other by signal lines arranged in various ways.

The display panel includes a light emitting element that generates the image. The input sensing layer includes sensing electrodes that sense the external input.

SUMMARY

Embodiments of the present disclosure provide an electronic apparatus that has an improved reliability.

Embodiments of the inventive concept provide an electronic apparatus that includes a display panel that includes a circuit element layer that includes a plurality of transistors and a display element layer that includes first electrodes connected to the transistors, a second electrode disposed on the first electrodes, a plurality of light emitting patterns each being disposed on a corresponding first electrode, and reflective compensation electrodes spaced apart from the first electrodes. The display panel further includes light emitting areas in which the light emitting patterns and the first electrodes are disposed, light transmitting areas in which transmission openings spaced apart from the light emitting patterns are formed through a portion of the circuit element layer and the display element layer, and reflective compensation areas in which the reflective compensation electrodes are disposed. The electronic apparatus further includes an electronic module disposed under the display panel and that overlaps the light transmitting areas and is spaced apart from the reflective compensation areas.

The display panel includes a first display are in which the light emitting areas are arranged in a first direction and a second direction that crosses the first direction, and a second display area that includes a first transmission portion that includes the light emitting areas and the light transmitting areas and a second transmission portion that includes the light emitting areas and the reflective compensation areas. The electronic module overlaps the first transmission portion.

The number of the light emitting patterns disposed in the second display area per unit area is less than a number of the light emitting patterns disposed in the first display area per unit area.

The number of the light emitting patterns disposed in the first transmission portion per unit area is equal to a number of the light emitting patterns disposed in the second transmission portion per unit area.

The second transmission portion extends the first direction, and the first display area and the second display area are arranged in the second direction.

The circuit element layer includes a plurality of insulating layers, and the first electrodes and the reflective compensation electrode are disposed on an insulating layer closest to the display element layer.

The display element layer includes a pixel definition layer through which a plurality of openings are formed, and the first electrodes and the reflective compensation electrode are exposed through the openings in the pixel definition layer.

The reflective compensation electrode includes a same material as the first electrodes.

Each of the transistors includes a semiconductor layer, a control electrode disposed on and insulated from the semiconductor layer, an input electrode insulated from the control electrode and connected to the semiconductor layer, and an output electrode insulated from the control electrode, spaced apart from the input electrode, and connected to the semiconductor layer, and the reflective compensation electrode receives a same voltage as one of the control electrode, the input electrode, and the output electrode.

The second transmission portion has an area greater than that of the first transmission portion.

The electronic module includes at least one of an audio output module, a light emitting module, a light receiving module, or a camera module.

Embodiments of the inventive concept provide an electronic apparatus that includes a display panel that includes a plurality of light emitting elements, each including a first electrode, a second electrode disposed on the first electrode, and a light emitting pattern disposed between the first electrode and the second electrode, and an electronic module disposed under the display panel. The display panel includes a first display area that includes light emitting areas in which the light emitting patterns and the first electrodes are arranged in a matrix shape and a second display area that includes a first transmission portion that overlaps the electronic module and a second transmission portion that surrounds the first transmission portion, the first transmission portion includes the light emitting areas and light transmitting areas in which the light emitting patterns and the first electrodes are disposed, and the second transmission portion includes the light emitting areas and reflective compensation areas in which the light emitting patterns are not disposed and the first electrodes are arranged in the matrix shape. The electronic module overlaps the first transmission portion.

The number of the light emitting patterns disposed in the second display area per unit area is less than a number of the light emitting patterns disposed in the first display area per unit area.

The number of the light emitting patterns disposed in the first transmission portion per unit area is equal to a number of the light emitting patterns disposed in the second transmission portion per unit area.

Each of the light emitting areas includes at least one of a first light emitting area, a second light emitting area, or a third light emitting area, which generate different light from each other.

At least two light emitting areas of the first, second, and third light emitting areas are arranged in a predetermined direction.

At least two light emitting areas of the first, second, and third light emitting areas have different sizes from each other.

At least one light emitting area of the light emitting areas further includes a light emitting area that generates a same light as one of the first, second, or third light emitting areas.

The second transmission portion has an area greater than that of the first transmission portion.

The electronic module includes at least one of an audio output module, a light emitting module, a light receiving module, or a camera module.

According to the above, an electronic module is disposed under a display panel. In this case, the area of the display panel, which overlaps the electronic module, has a relatively higher transmittance than the area of the display panel adjacent thereto, and thus, the electronic module has improved performance.

In addition, as the electronic apparatus includes reflective compensation electrodes to prevent the high transmittance area from being externally viewed due to reflectance differences with an adjacent area, the electronic apparatus has improved visibility.

BRIEF DESCRIPTION OF THE DRAWINGS

The above and other advantages of the present disclosure will become readily apparent by reference to the following detailed description when considered in conjunction with the accompanying drawings.

DETAILED DESCRIPTION

Figure 1A:
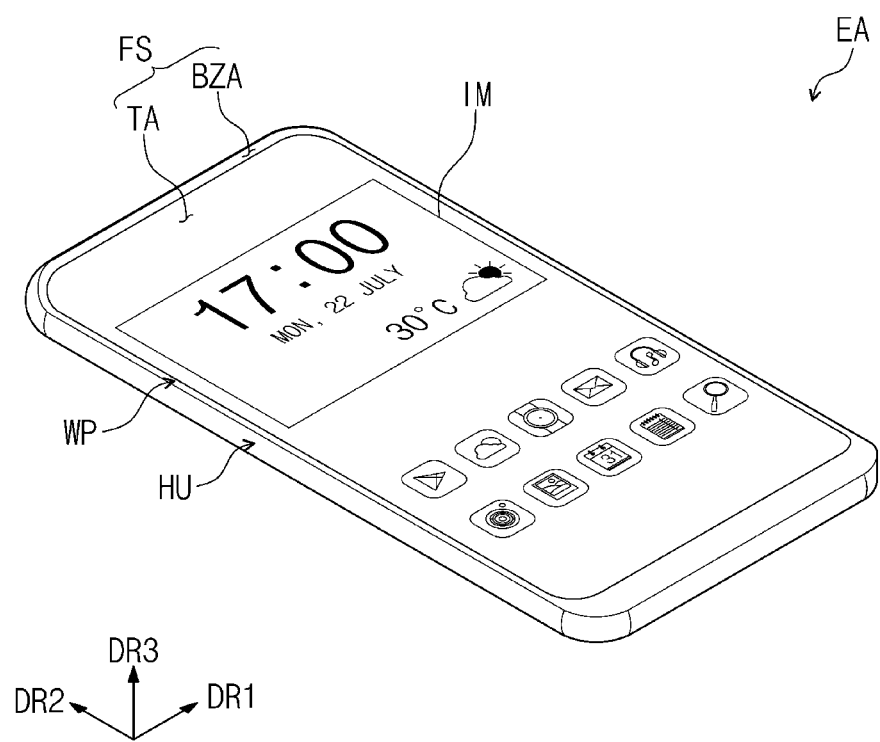
FIG. 1A is a perspective view of an electronic apparatus according to an exemplary embodiment of the present disclosure.

In the present disclosure, it will be understood that when an element or layer is referred to as being "on", "connected to" or "coupled to" another element or layer, it can be directly on, connected or coupled to the other element or layer or intervening elements or layers may be present.

Like numerals may refer to like elements throughout. In the drawings, the thickness, ratio, and dimension of components may be exaggerated for effective description of the technical content.

As used herein, the term "and/or" may include any and all combinations of one more of the associated listed items.

It will be understood that, although the terms first, second, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present disclosure. As used herein, the singular forms, "a", "an" and "the" are intended to include the plural forms as well, unless the context clearly indicates otherwise.

Spatially relative terms, such as "beneath", "below", "lower", "above", "upper" and the like, may be used herein for ease of description to describe one element or features relationship to another element(s) or feature(s) as illustrated in the figures.

Unless otherwise defined, all terms, including technical and scientific terms, used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

It will be further understood that the terms "may include" and/or "including", when used in this specification, specify the presence of stated features, integers, steps, operations, elements, and/or components, but do not preclude the presence or addition of one or more other features, integers, steps, operations, elements, components, and/or groups thereof. Hereinafter, the present disclosure will be explained in detail with reference to the accompanying drawings.

Figure 1B:
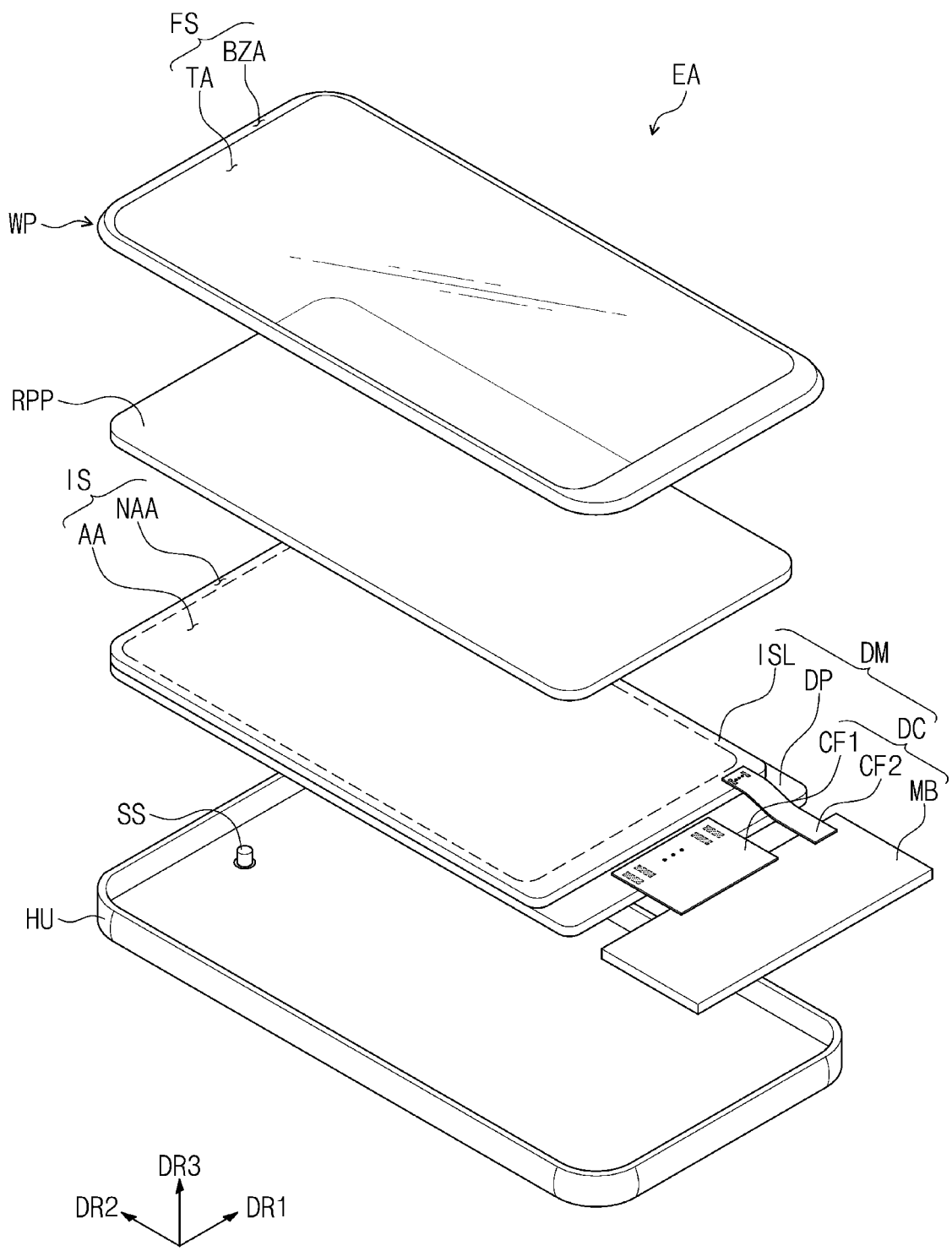
FIG. 1B is an exploded view of an electronic apparatus according to an exemplary embodiment of the present disclosure.
Figure 1C:
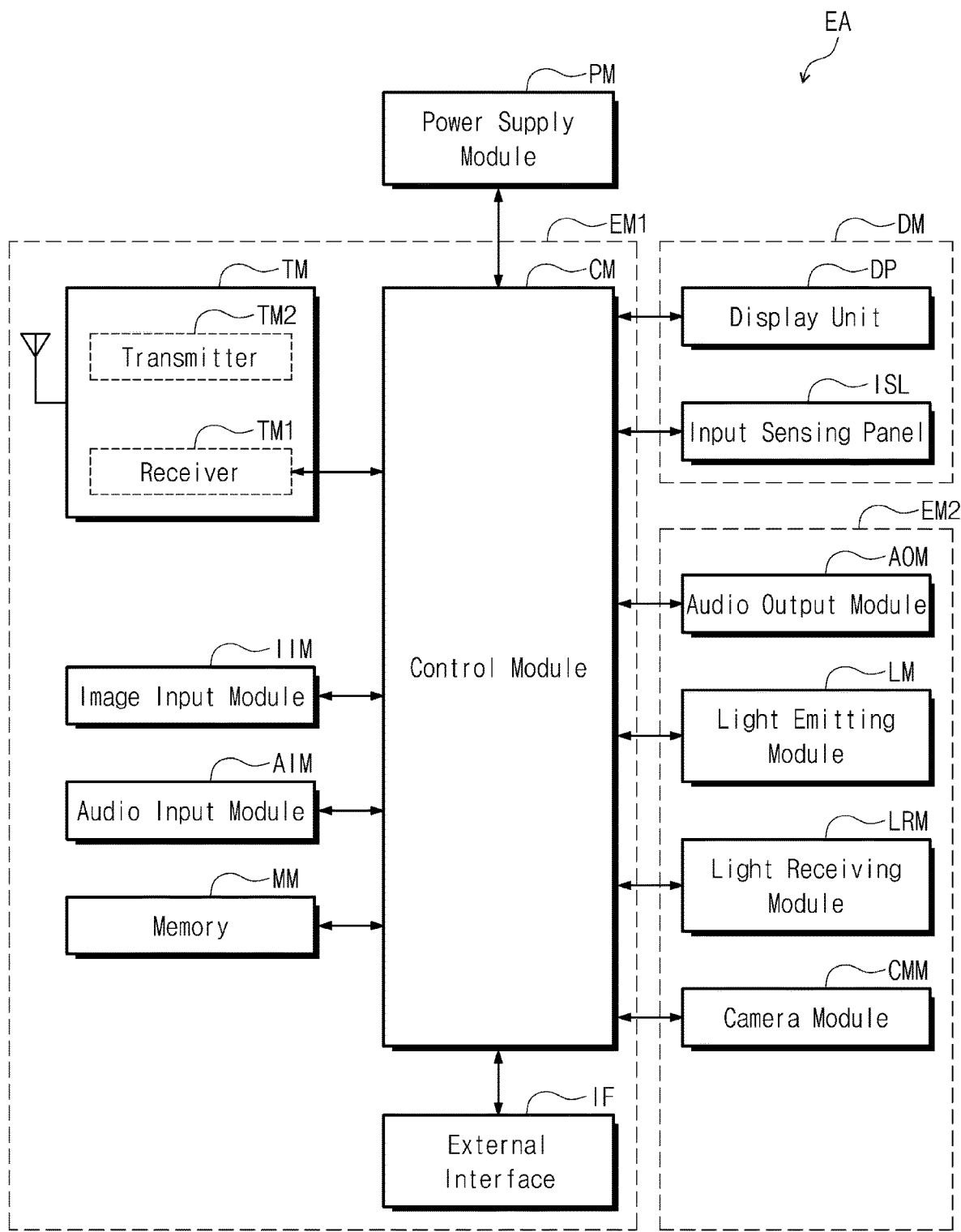
FIG. 1C is a block diagram of an electronic apparatus according to an exemplary embodiment of the present disclosure.
Figure 2A:
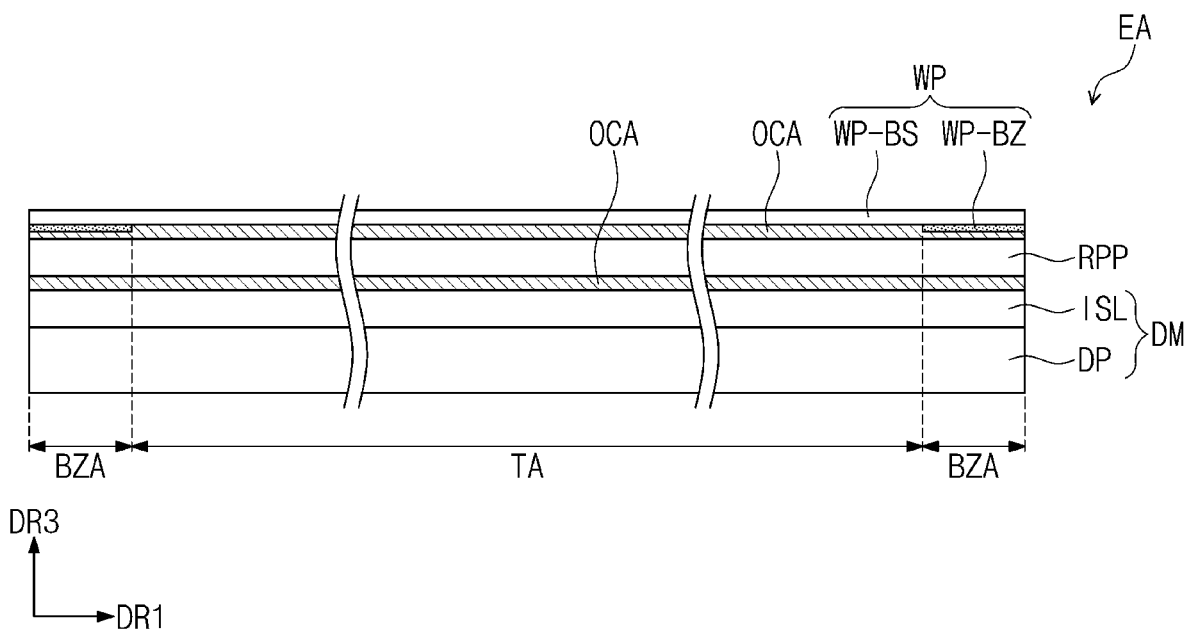
FIG. 2A is a cross-sectional view of an electronic apparatus according to an exemplary embodiment of the present disclosure.
Figure 2B:
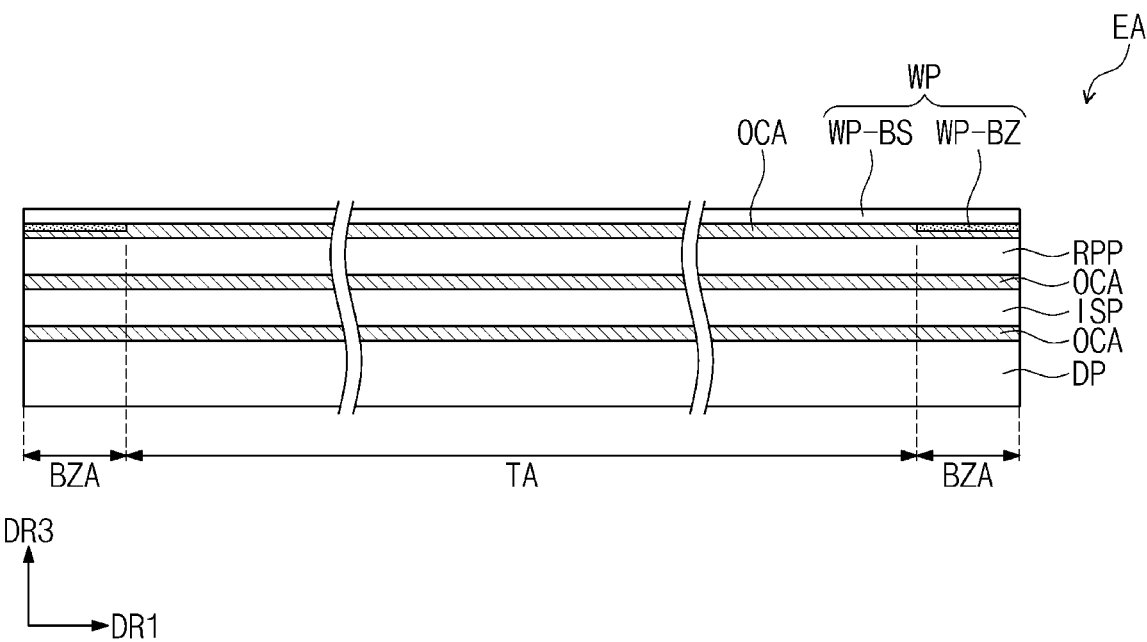
FIG. 2B is a cross-sectional view of an electronic apparatus according to an exemplary embodiment of the present disclosure.

FIG. 1A is a perspective view of an electronic apparatus EA according to an exemplary embodiment of the present disclosure. FIG. 1B is an exploded view of the electronic apparatus EA according to an exemplary embodiment of the present disclosure. FIG. 1C is a block diagram of the electronic apparatus EA according to an exemplary embodiment of the present disclosure. FIG. 2A is a cross-sectional view of the electronic apparatus EA according to an exemplary embodiment of the present disclosure. FIG. 2B is a cross-sectional view of an electronic apparatus EA according to an exemplary embodiment of the present disclosure.

Figure 3:
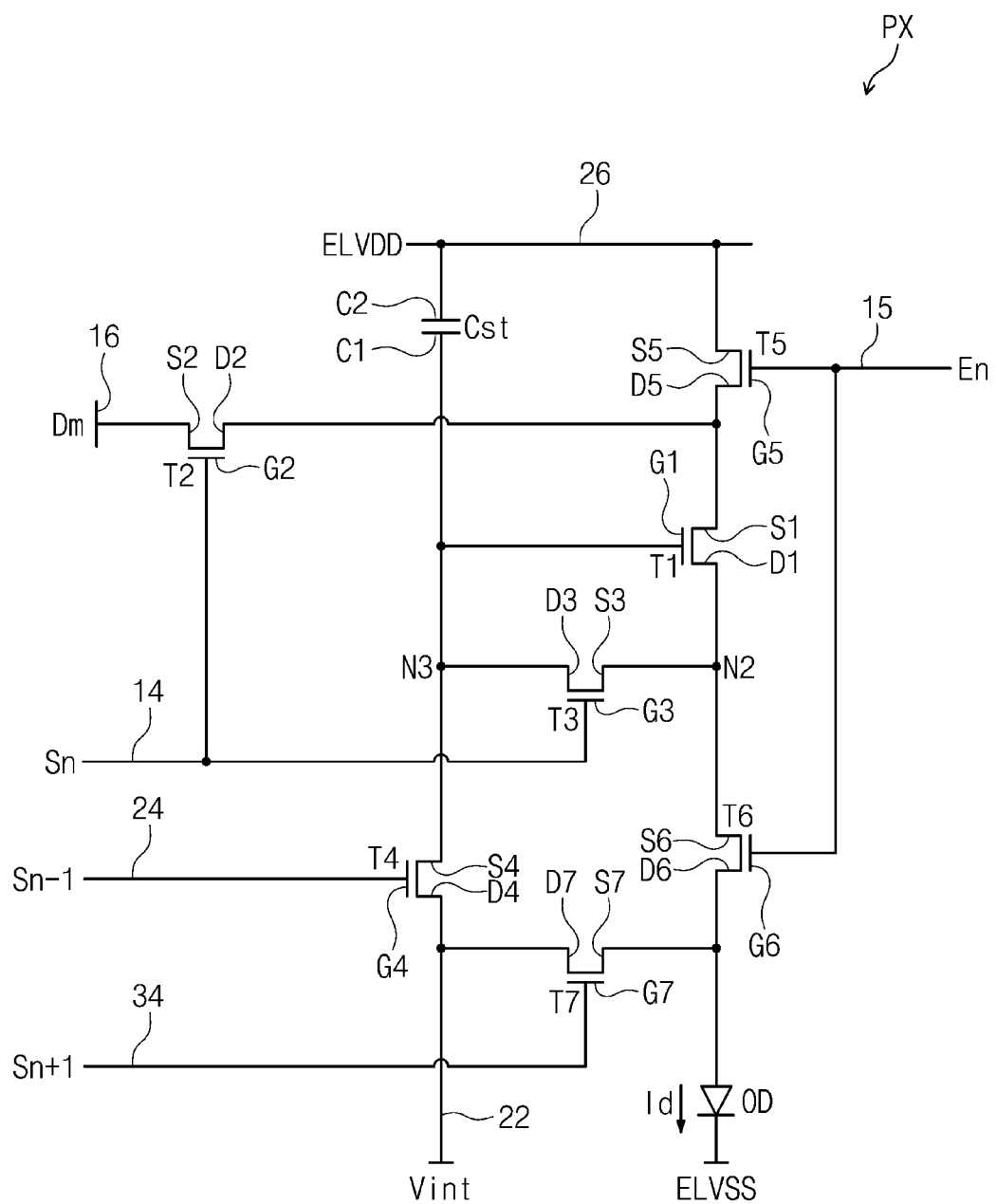
FIG. 3 is an equivalent circuit diagram of a pixel according to an exemplary embodiment of the present disclosure.

FIG. 3 is an equivalent circuit diagram of a pixel according to an exemplary embodiment of the present disclosure.

Referring to FIGS. 1A and 1B, according to an embodiment, the electronic apparatus EA is activated in response to an electrical signal. The electronic apparatus EA includes various embodiments. For example, the electronic apparatus EA may be incorporated into a large-sized electronic item, such as a television set, a monitor, or an outdoor billboard, or a small and medium-sized electronic item, such as a personal computer, a notebook computer, a personal digital assistants, a car navigation unit, a game unit, a mobile electronic device, or a camera. These are merely exemplary, and in other embodiments, the electronic apparatus EA may be incorporated into other electronic devices as long as they do not depart from the concept of the present disclosure. In a present exemplary embodiment, a smartphone will be described as the electronic apparatus EA.

According to an embodiment, the electronic apparatus EA displays toward a third direction DR3 an image IM through a display surface FS that is substantially parallel to a plane defined by a first direction DR1 and a second direction DR2. The image IM may be a moving image or a still image. FIG. 1A shows a clock widget and application icons as a representative examples of the image IM. The display surface FS through which the image IM is displayed corresponds to a front surface of the electronic apparatus EA and a front surface of a window panel WP.

In a present exemplary embodiment, front (or upper) and rear (or lower) surfaces of each member of the electronic apparatus EA are defined with respect to a direction in which the image IM is displayed. The front and rear surfaces face each other in the third direction DR3, and a normal direction of each of the front and rear surfaces is substantially parallel to the third direction DR3. Directions indicated by the first, second, and third directions DR1, DR2, and DR3 are relative to each other and may be changed to other directions.

The electronic apparatus EA according to an exemplary embodiment of the present disclosure can sense an externally applied user input. The external input may take various forms of received from outside of the electronic apparatus EA. The external inputs may be received in a variety of ways. For example, the external inputs may include a proximity input, such as hovering, applied when approaching close to or adjacent to the electronic apparatus EA at a predetermined distance as well as a touch input by a part of a user's body, such as a user's hand. In addition, the external inputs may be provided in the form of force, pressure, light, etc., however, embodiments are not limited thereto. In addition, the electronic apparatus EA may sense a user's input applied to a side or rear surface of the electronic apparatus EA, depending on a structure of the electronic apparatus EA, however, the electronic apparatus EA should not be limited to a particular embodiment.

According to an embodiment, the electronic apparatus EA includes the window panel WP, an anti-reflective panel RPP, a display module DM, an electronic module SS, and a housing HU. In a present exemplary embodiment, the window panel WP and the housing HU are coupled to each other to appear as the electronic apparatus EA.

According to an embodiment, the window panel WP is an insulating panel. For example, the window panel WP may include glass, plastic, or a combination thereof.

According to an embodiment, the front surface FS of the window panel WP is the front surface of the electronic apparatus EA as described above. The front surface FS includes a transmissive area TA that is optically transparent. For example, the transmissive area TA has a visible light transmittance equal to or greater than about 90%.

According to an embodiment, the front surface FS includes a bezel area BZA that has a relatively lower transmittance as compared with the transmissive area TA. The bezel area BZA defines a shape of the transmissive area TA. The bezel area BZA is disposed adjacent to the transmissive area TA and surrounds the transmissive area TA.

According to an embodiment, the bezel area BZA has a predetermined color. The bezel area BZA covers a peripheral area NAA of a front surface IS of the display module DM to prevent the peripheral area NAA from being viewed from the outside. However, this is merely exemplary, and the bezel area BZA may be omitted from the window panel WP according to other exemplary embodiments of the present disclosure.

According to an embodiment, the anti-reflective panel RPP is disposed under the window panel WP. The anti-reflective panel RPP reduces reflectance of external light incident thereto from above the window panel WP.

According to an embodiment, the display module DM includes a display panel DP that displays the image IM and an input sensing layer ISL that senses the external input. The display module DM includes a front surface IS that includes an active area AA and the peripheral area NAA. The active area AA is activated in response to an electrical signal.

In a present exemplary embodiment, the active area AA is an area through which the image IM is displayed and the external input is sensed. The transmissive area TA of the display surface SF overlaps at least the active area AA. For example, the transmissive area TA overlaps an entire surface of or at least a portion of the active area AA. Accordingly, a user can perceive the image IM or provide an external input through the transmissive area TA, however, this is merely exemplary. That is, an area through which the image IM is displayed and an area through which the external input is sensed may be separated from each other in the active area AA, however, embodiments are not limited thereto.

According to an embodiment, the peripheral area NAA is covered by the bezel area BZA. The peripheral area NAA is disposed adjacent to the active area AA. The peripheral area NAA surrounds the active area AA. A driving circuit or a driving line is disposed in the peripheral area NAA to drive the active area AA.

In a present exemplary embodiment, the display module DM is assembled in a flat state in which the active area AA and the peripheral area NAA face the window panel WP, however, embodiments are not limited thereto. According to another embodiments, a portion of the peripheral area NAA of the display module DM is curved. In this case, a portion of the peripheral area NAA is bent to the rear surface of the electronic apparatus EA, and thus, the bezel area BZA in the front surface of the electronic apparatus EA is reduced. In another embodiment, the display module DM is assembled while a portion of the active area AA is in a curved state. Further, in still other embodiments, the peripheral area NAA is omitted from the display module DM.

According to an embodiment, the display module DM includes the display panel DP, the input sensing layer ISL, and the driving circuit DC.

According to an embodiment, the display panel DP generates the image IM. The image IM generated by the display panel DP is perceived by a user through the transmissive area TA.

According to an embodiment, the input sensing layer ISL can sense an external input. As described above, the input sensing layer ISL can sense the external input applied to the window panel WP.

According to an embodiment, the driving circuit DC is electrically connected to the display panel DP and the input sensing layer ISL. The driving circuit DC includes a main circuit board MB, a first circuit board CF1, and a second circuit board CF2.

According to an embodiment, the first circuit board CF1 is electrically connected to the display panel DP. The first circuit board CF1 connects the display panel DP and the main circuit board MB. In a present exemplary embodiment, a flexible circuit film is shown as the first circuit board CF1, however, this is merely exemplary, and embodiments are not limited thereto. In other embodiments, the first circuit board CF1 is not connected to the main circuit board MB or is a rigid board.

According to an embodiment, the first circuit board CF1 is connected to display pads of the display panel DP, which are disposed in the peripheral area NAA. The first circuit board CF1 transmits electrical signals to the display panel DP to drive the display panel DP. The electrical signals are generated by the first circuit board CF1 or the main circuit board MB.

According to an embodiment, the second circuit board CF2 is electrically connected to the input sensing layer ISL. The second circuit board CF2 connects the input sensing layer ISL and the main circuit board MB. In a present exemplary embodiment, a flexible circuit film is shown as the second circuit board CF2, however, this is merely exemplary, and embodiments are not limited thereto. In other embodiments, the second circuit board CF2 is not connected to the main circuit board MB or is a rigid board.

According to an embodiment, the second circuit board CF2 is connected to sensing pads of the input sensing layer ISL, which are disposed in the peripheral area NAA. The second circuit board CF2 transmits electrical signals to the input sensing layer ISL to drive the input sensing layer ISL. The electrical signals are generated by the second circuit board CF2 or the main circuit board MB.

According to an embodiment, the main circuit board MB includes various driving circuits to drive the display module DM and a connector to provide a power source. The first and second circuit boards CF1 and CF2 are connected to the main circuit board MB. According to a present disclosure, the display module DM can be controlled by one main circuit board MB, however, this is merely exemplary, and embodiments are not limited thereto. In the display module DM according to another exemplary embodiment of the present disclosure, the display panel DP and the input sensing layer ISL are connected to different main circuit boards, and one of the first and second circuit boards CF1 and CF2 is not connected to the main circuit board MB, however, embodiments are not limited thereto.

According to an embodiment, the electronic module SS is disposed under the display module DM. The electronic module SS is disposed under the display panel DP. The electronic module SS overlaps the active area AA in a plan view. Accordingly, the bezel area BZA need not have a space for the electronic module SS, and thus, the bezel area BZA need not increase in size. The electronic module SS receives an external input through the transmissive area TA or transmits an output through the transmissive area TA. FIG. 1B shows one electronic module SS disposed at an upper portion of the housing HU, however, embodiments are not limited thereto, and in other embodiments, the number and position of the electronic modules SS can vary as long as the electronic modules SS overlap the active area AA.

According to a present disclosure, as the electronic module SS is disposed under the display panel DP, an area of the display panel DP has a relatively higher transmittance than that of adjacent areas. Detailed descriptions thereof will be described below.

According to an embodiment, the housing HU is coupled to the window panel WP. The housing HU is coupled to the window panel WP to provide a predetermined internal space. The display module DM, anti-reflective panel RPP and the electronic module SS are accommodated in the internal space.

According to an embodiment, the housing HU includes a highly rigid material. For example, the housing HU may include glass, plastic, or a metal or a plurality of frames or plates of combinations thereof. The housing HU stably protects the components accommodated in the internal space from external impacts.

Referring to FIG. 1C, according to an embodiment, the electronic apparatus EA includes the display module DM, a power supply module PM, a first electronic module EM1, and a second electronic module EM2. The display module DM, the power supply module PM, the first electronic module EM1, and the second electronic module EM2 are electrically connected to each other. FIG. 1C shows the display panel DP and the input sensing layer ISL of components of the display module DM as a representative example.

According to an embodiment, the first electronic module EM1 and the second electronic module EM2 include various functional modules to operate the electronic apparatus EA. The first electronic module EM1 is directly mounted on a mother board electrically connected to the display panel DP or is electrically connected to the mother board through a connector (not shown) after being mounted on a separate board.

According to an embodiment, the first electronic module EM1 includes a control module CM, a wireless communication module TM, an image input module IIM, an audio input module AIM, a memory MM, and an external interface IF. Some of the modules may be electrically connected to the mother board through a flexible printed circuit board without being mounted on the mother board.

According to an embodiment, the control module CM controls the overall operation of the electronic apparatus EA. The control module CM may be, but is not limited to, a microprocessor. For example, the control module CM can activate or deactivate the display panel DP. The control module CM controls other modules, such as, the image input module IIM or the audio input module AIM, based on a touch signal received from the display panel DP.

According to an embodiment, the wireless communication module TM transmits/receives wireless signals to/from another terminal by using a Bluetooth or Wi-Fi link. The wireless communication module TM can transmit/receive a voice signal by using a conventional communication line. The wireless communication module TM includes a transmitter TM1 that modulates a signal to be transmitted and transmits the modulated signal and a receiver TM2 that demodulates a received signal.

According to an embodiment, the image input module IIM processes an image signal and converts the image signal into image data that can be displayed through the display module DM. The audio input module AIM receives an external audio signal through a microphone in a recording mode and a voice recognition mode and converts the audio signal into electrical voice data.

According to an embodiment, the external interface IF serves as an interface between the control module CM and external devices, such as an external charger, a wired/wireless data port, or a card socket, such as a memory card or a SIM/UIM card.

According to an embodiment, the second electronic module EM2 includes an audio output module AOM, a light emitting module LM, a light receiving module LRM, and a camera module CMM. The components of the second electronic module EM2 may be directly mounted on the mother board, electrically connected to the display module DM through a connector after being mounted on a separate substrate, or are electrically connected to the first electronic module EM1.

According to an embodiment, the audio output module AOM converts and outputs audio data received from the wireless communication module TM or audio data stored in the memory MM.

According to an embodiment, the light emitting module LM generates and emits light. The light emitting module LM emits infrared light. The light emitting module LM includes a light emitting diode (LED). The light receiving module LRM senses infrared light. The light receiving module LRM is activated when sensing an infrared light whose intensity is equal to or greater than a predetermined level. The light receiving module LRM includes a complementary metal oxide semiconductor (CMOS) sensor. The infrared light generated by the light emitting module LM is incident into the light receiving module LRM after being emitted from the light emitting module LM and being reflected by an external object, such as a user's finger or face. The camera module CMM can photograph an image of an external object.

The electronic module SS according to an exemplary embodiment of the present disclosure includes at least one component of the first electronic module EM1 and the second electronic module EM2. For example, the electronic module SS includes at least one of a camera, a speaker, a light sensing sensor, or a heat sensing sensor. The electronic module SS can sense an external subject through the front surface IS or can output a sound signal, such as a voice, through the front surface IS. In addition, the electronic module SS includes a plurality of components, however, embodiments are not limited thereto.

According to an embodiment of the present disclosure, the electronic module SS overlaps the transmissive area TA in a plan view. Accordingly, an increase of the bezel area BZA due to the accommodation of the electronic module SS can be prevented, and thus, an aesthetic design of the electronic apparatus EA can be improved.

FIGS. 2A and 2B are cross sectional views of the electronic apparatus EA that show a stack relationship of functional members of the electronic apparatus EA. The electronic apparatus EA according to an exemplary embodiment of the present disclosure includes the display panel DP, the input sensing layer ISL, the anti-reflective panel RPP, and the window panel WP. At least some components of the display panel DP, the input, sensing layer ISL, the anti-reflective panel RPP, and the window panel WP are formed through consecutive processes or are coupled to each other by an adhesive member.

According to an embodiment, FIGS. 2A and 2B show an optically clear adhesive OCA as the adhesive member. The adhesive member described hereinbelow includes a conventional adhesive or pressure sensitive adhesive. In an exemplary embodiment of the present disclosure, the anti-reflective panel RPP and the window panel WP may be replaced with other components or may be omitted.

In FIGS. 2A and 2B, according to an embodiment, a component, such as the input sensing layer ISL, formed through the consecutive processes with the display panel DP is referred to as a "layer". A component, such as an input sensing part ISP, coupled to the display panel DP by the adhesive member is referred to as a "part". The "part" includes a base layer that provides a base surface, such as a synthetic resin film, a composite film, or a glass substrate, however, the base layer is omitted from the "layer". In other words, a component, such as the input sensing layer ISL, referred to as a "layer" is disposed on the base surface provided by other components.

As shown in FIG. 2A, according to an embodiment, the electronic apparatus EA includes the display panel DP, the input sensing layer ISL, the anti-reflective panel RPP, and the window panel WP. The input sensing layer ISL is disposed directly on the display panel DP. In an embodiment of the present disclosure, an expression that component "B" is disposed directly on component "A" means that no intervening elements, such as an adhesive layer/an adhesive member, are present between the component "B" and the component "A". The component "B" is formed on a base surface provided by the component "A" through successive processes after the component "A" is formed.

In addition, as shown in FIG. 2B, according to an embodiment, the electronic apparatus EA includes the display panel DP, the input sensing part ISP, the anti-reflective panel RPP, and the window panel WP. The input sensing part ISP is attached to the anti-reflective panel RPP by the optically clear adhesive OCA, however, embodiments are not limited thereto. For example, in other embodiments, a stacking order of the input sensing part ISP and the anti-reflective panel RPP is changed. In addition, the input sensing part ISP is attached to the display panel DP by the optically clear adhesive OCA.

The window panel WP according to an exemplary embodiment of the present disclosure includes a base layer WP-BS and a light shielding pattern WP-BZ. The base layer WP-BS includes a glass substrate and/or a synthetic resin film. The base layer WP-BS is not limited to a single-layer structure. The base layer WP-BS may include two or more films attached to each other by an adhesive member.

According to an embodiment, the light shielding pattern WP-BZ partially overlaps the base layer WP-BS. The light shielding pattern WP-BZ is disposed on a surface of the base layer WP-BS that extends between the light shielding pattern WP-BZ and the anti-reflective panel RPP and substantially defines the bezel area BZA of the electronic apparatus EA. An area in which the light shielding pattern WP-BZ is not disposed is the transmissive area TA of the electronic apparatus EA.

According to an embodiment, the anti-reflective panel RPP reduces reflectance of external light incident thereto from an upper side of the window panel WP. The anti-reflective panel RPP according to an exemplary embodiment of the present disclosure may include a retarder or a polarizer.

FIG. 3 shows an equivalent circuit diagram of the pixel PX included in the display panel DP as a representative embodiment. The pixel PX includes a plurality of transistors T1 to T7, a storage capacitor Cst, and a light emitting diode OD.

According to an embodiment, except for the light emitting diode OD, the components of the pixel PX, i.e., the transistors T1 to T7 and the storage capacitor Cst, are driving elements.

According to an embodiment, the transistors T1 to T7 include a driving transistor T1, a switching transistor T2, a compensation transistor T3, an initialization transistor T4, a first light emitting control transistor T5, a second light emitting control transistor T6, and a bypass transistor T7.

According to an embodiment, the pixel PX includes a first gate line 14 that transmits an n-th scan signal Sn to the switching transistor T2 and the compensation transistor T3, a second gate line 24 that transmits an (n−1)th scan signal Sn−1 to the initialization transistor T4, a third gate line 34 that transmits an (n+1)th scan signal Sn+1 to the bypass transistor T7, a light emitting line 15 that transmits a light emitting control signal En to the first light emitting control transistor T5 and the second light emitting control transistor T6, a power line 26 that transmits a power supply voltage ELVDD, and an initialization voltage line 22 that transmits an initialization voltage Vint to initialize the driving transistor T1.

According to an embodiment, a gate electrode G1 of the driving transistor T1 is connected to a first electrode C1 of the storage capacitor Cst. A source electrode S1 of the driving transistor T1 is connected to the power line 26 via the first light emitting control transistor T5. A drain electrode D1 of the driving transistor T1 is electrically connected to an anode of the light emittingg diode OD via the second light emitting control transistor T6. The driving transistor T1 receives a data signal Dm in accordance with a switching operation of the switching transistor T2 and transmits a driving current Id to the light emitting diode OD.

According to an embodiment, a gate electrode G2 of the switching transistor T2 is connected to the first gate line 14. A source electrode S2 of the switching transistor T2 is connected to the data line 16. A drain electrode D2 of the switching transistor T2 is connected to the source electrode S1 of the driving transistor T1 and to the power line 26 via the first light emitting control transistor T5. The switching transistor T2 performs a switching operation in which the switching transistor T2 turns on in response to the n-th scan signal Sn applied thereto through the first gate line 14 and transmits the data signal Dm received from the data line 16 to the source electrode S1 of the driving transistor T1.

According to an embodiment, a gate electrode G3 of the compensation transistor T3 is connected to the first gate line 14. A source electrode S3 of the compensation transistor T3 is connected to the drain electrode D1 of the driving transistor T1 and to the anode of the light emitting diode OD via the second light emitting control transistor T6. A drain electrode D3 of the compensation transistor T3 is connected to the first electrode C1 of the storage capacitor Cst, a source electrode S4 of the initialization transistor T4, and the gate electrode G1 of the driving transistor T1. The compensation transistor T3 turns on in response to the n-th scan signal Sn received through the first gate line 14 and connects the gate electrode G1 to the drain electrode D1 of the driving transistor T1, thereby forming a diode connection of the driving transistor T1.

According to an embodiment, a gate electrode G4 of the initialization transistor T4 is connected to the second gate line 24. A drain electrode D4 of the initialization transistor T4 is connected to the initialization voltage line 22. The source electrode S4 of the initialization transistor T4 is connected to the first electrode C1 of the storage capacitor Cst, the drain electrode D3 of the compensation transistor T3, and the gate electrode G1 of the driving transistor T1. The initialization transistor T4 turns on in response to the (n−1)th scan signal Sn−1 received through the second gate line 24 and transmits the initialization voltage Vint to the gate electrode G1 of the driving transistor T1, thereby initializing a voltage of the gate electrode G1 of the driving transistor T1.

According to an embodiment, a gate electrode G5 of the first light emitting control transistor T5 is connected to the light emitting line 15. The first light emitting control transistor T5 is connected between the power line 26 and the driving transistor T1. A source electrode S5 of the first light emitting control transistor T5 is connected to the power line 26. A drain electrode D5 of the first light emitting control transistor T5 is connected to the source electrode S1 of the driving transistor T1 and the drain electrode D2 of the switching transistor T2. When the light emitting control signal En is applied to the gate electrode G5 of the first light emitting control transistor T5, the first light emitting control transistor T5 is turned on, and thus, the driving current Id flows through the light emitting diode OD. A time at which the driving current Id flows through the light emitting diode OD is determined by using the first light emitting control transistor T5.

According to an embodiment, a gate electrode G6 of the second light emitting control transistor T6 is connected to the light emitting line 15. The second light emitting control transistor T6 is connected between the driving transistor T1 and the light emitting diode OD. A source electrode S6 of the second light emitting control transistor T6 is connected to the drain electrode D1 of the driving transistor T1 and the source electrode S3 of the compensation transistor T3. A drain electrode D6 of the second light emitting control transistor T6 is electrically connected to the anode of the light emitting diode OD. The first light emitting control transistor T5 and the second light emitting control transistor T6 are turned on in response to the light emitting control signal En received through the light emitting line 15. When the light emitting control signal En is transmitted to the gate electrode G6 of the second light emitting control transistor T6, the second light emitting control transistor T6 is turned on, and thus, the driving current Id flows through the light emitting diode OD. The time at which the driving current Id flows through the light emitting diode OD is determined by using the second light emitting control transistor T6.

According to an embodiment, a gate electrode G7 of the bypass transistor T7 is connected to the third gate line 34. A source electrode S7 of the bypass transistor T7 is connected to the anode of the light emitting diode OD. A drain electrode D7 of the bypass transistor T7 is connected to the initialization voltage line 22. The bypass transistor T7 is turned on in response to the (n+1)th scan signal Sn+1 received through the third gate line 34 and initializes the anode of the light emitting diode OD. According to an exemplary embodiment, the (n+1)th scan signal is substantially the same as the n-th scan signal.

According to an embodiment, a second electrode C2 of the storage capacitor Cst is connected to the power line 26. The first electrode C1 of the storage capacitor Cst is connected to the gate electrode G1 of the driving transistor T1, the drain electrode D3 of the compensation transistor T3, and the source electrode S4 of the initialization transistor T4.

A cathode of the light emitting diode OD receives a reference voltage ELVSS. The light emitting diode OD receives the driving current Id from the driving transistor T1 and emits light. The light emitting diode OD includes a light emitting material. The light emitting diode OD generates light whose color corresponds to the light emitting material. The color of the light generated by the light emitting diode OD is one of red, green, blue, or white.

According to another exemplary embodiment, the number of the transistors and the connection relationship between the transistors changes in various ways.

Figure 4A:
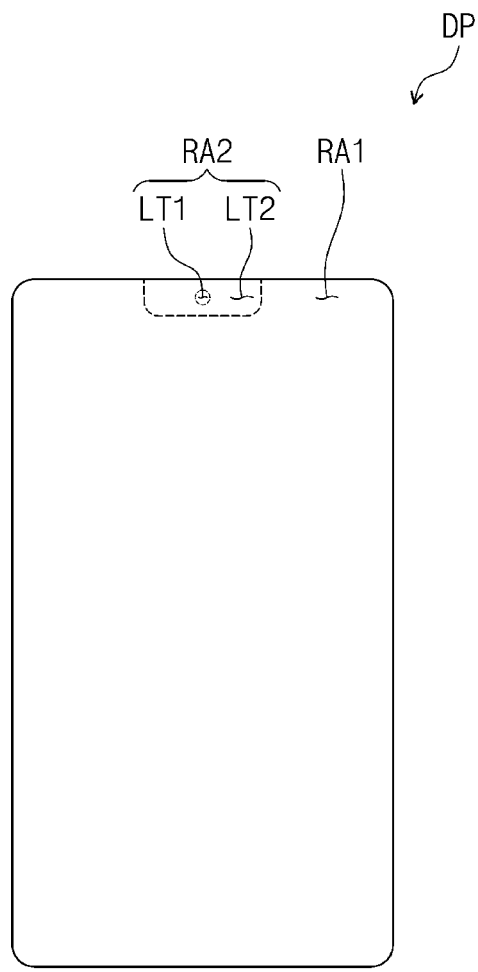
FIG. 4A is a plan view of a display panel according to an exemplary embodiment of the present disclosure.
Figure 4B:
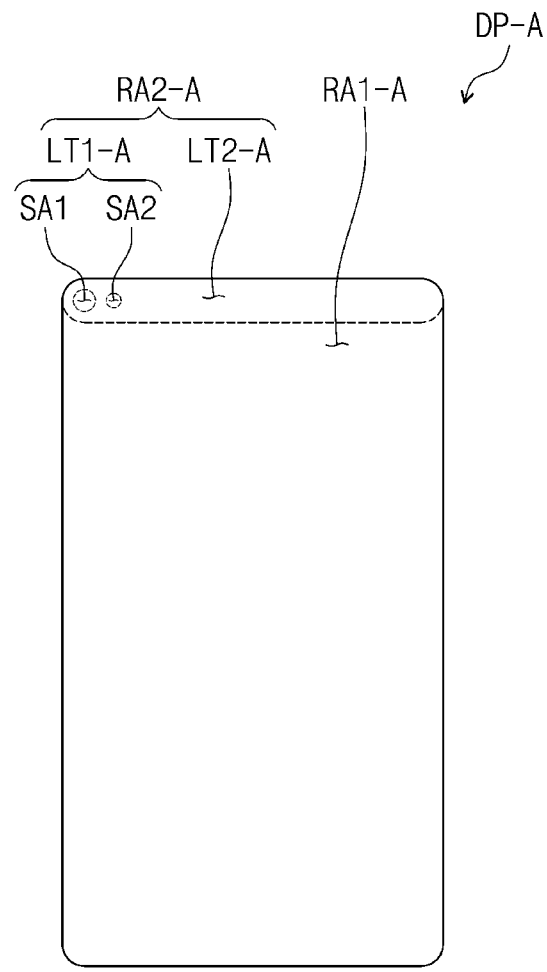
FIG. 4B is a plan view of a display panel according to an exemplary embodiment of the present disclosure.
Figure 5A:
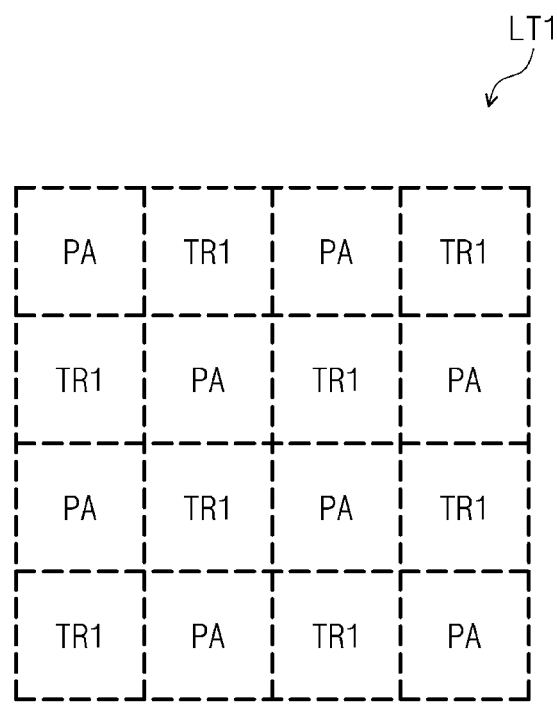
FIG. 5 is an enlarged plan view of a portion of a display panel according to an exemplary embodiment of the present disclosure.
FIG. 5B is a cross-sectional view of a portion of a display panel shown in FIG. 5A.
Figure 5B:
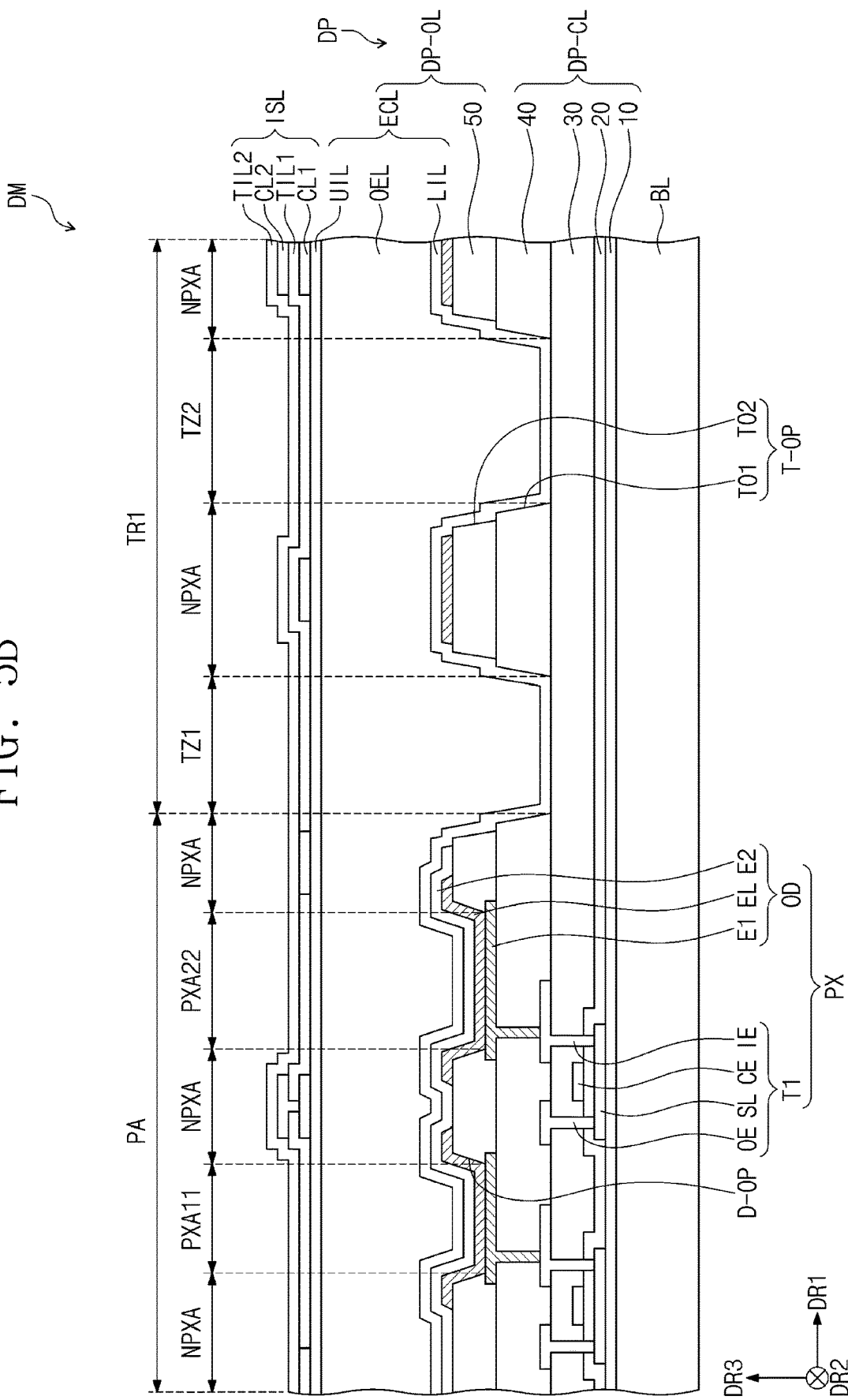
Figure 6A:
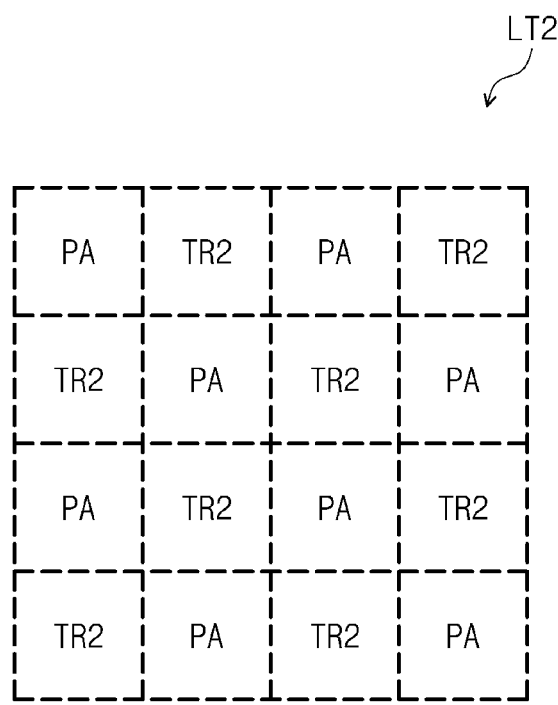
FIG. 6A is an enlarged plan view of a portion of a display panel according to an exemplary embodiment of the present disclosure.
Figure 6B:
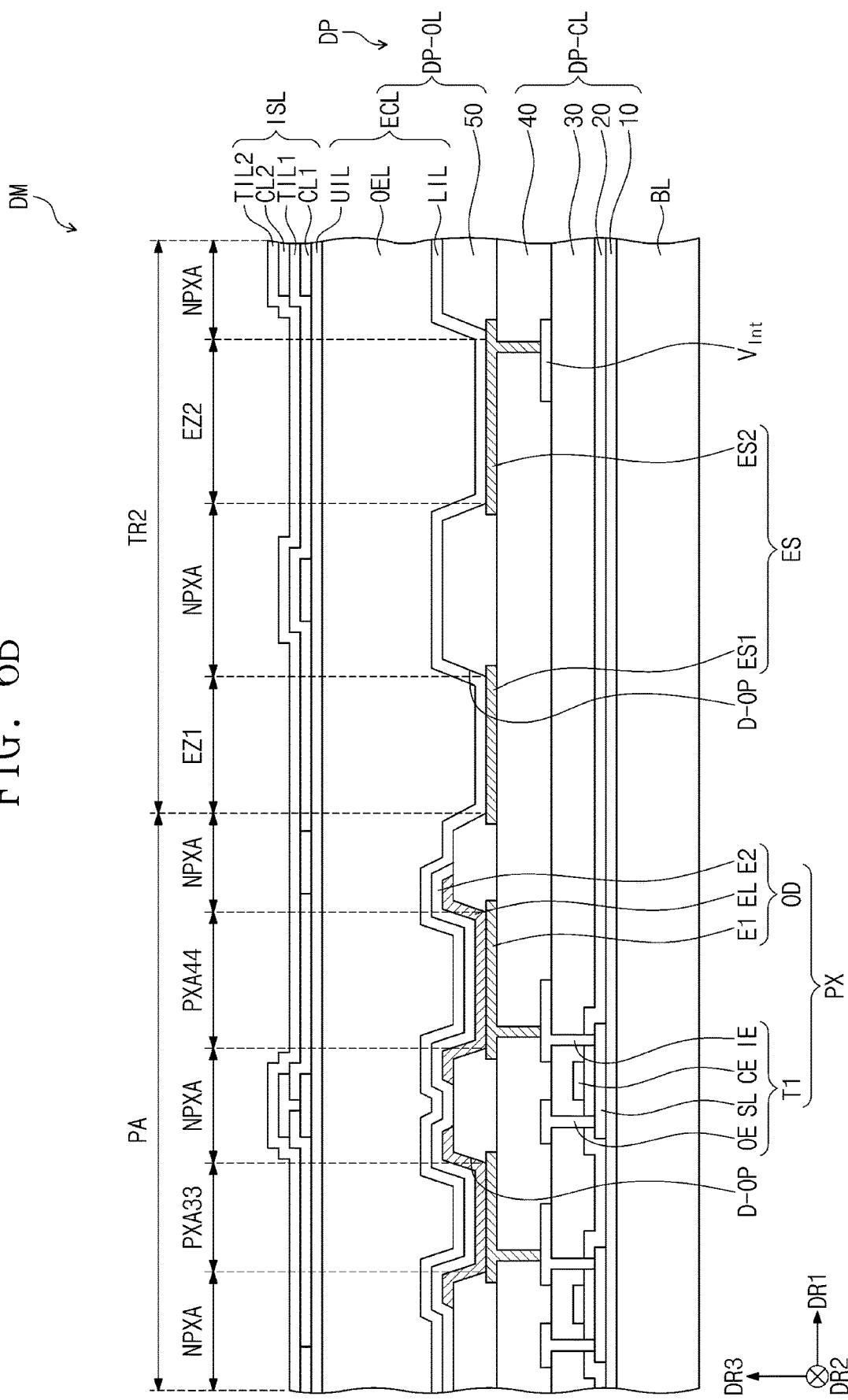
FIG. 6B is a cross-sectional view of a portion of a display panel shown in FIG. 6A.
Figure 7:
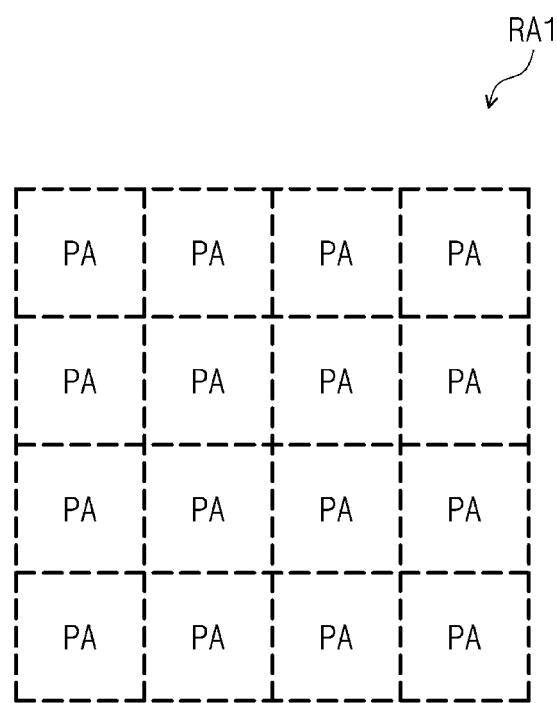
FIG. 7 is an enlarged plan view of a portion of a display panel according to an exemplary embodiment of the present disclosure.

FIG. 4A is a plan view of a display panel according to an exemplary embodiment of the present disclosure. FIG. 4B is a plan view of another display panel according to an exemplary embodiment of the present disclosure. FIG. 5A is an enlarged plan view of a portion of a display panel according to an exemplary embodiment of the present disclosure. FIG. 5B is a cross-sectional view of a portion of the display panel shown in FIG. 5A. FIG. 6A is an enlarged plan view of a portion of a display panel according to an exemplary embodiment of the present disclosure. FIG. 6B is a cross-sectional view of a portion of the display panel shown in FIG. 6A. FIG. 7 is an enlarged plan view of a portion of a display panel according to an exemplary embodiment of the present disclosure. In FIGS. 4A to 7, the same reference numerals may denote the same elements in FIGS. 1A to 3, and thus details thereof will be omitted.

FIGS. 4A and 4B are plan views of areas of display panels DP and DP-A according to exemplary embodiments of the present disclosure.

Referring to FIG. 4A, according to an embodiment, the display panel DP includes a first display area RA1 and a second display area RA2. The first display area RA1 surrounds at least a portion of the second display area RA2. FIG. 4A shows one second display area RA2 disposed at an upper end of the display panel DP and the first display area RA1 surrounding the second display area RA2, however, embodiments are not limited thereto, and there may be a plurality of second display areas RA2 in correspondence with a plurality of the electronic modules SS.

According to an embodiment, the second display area RA2 includes a first transmission portion LT1 and a second transmission portion LT2. The first transmission portion LT1 of the display panel DP is an area that overlaps the electronic module SS. The second transmission portion LT2 surrounds the first transmission portion LT1. The second transmission portion LT2 forms a boundary with the first display area RA1.

According to an embodiment of the present disclosure, the electronic module SS is disposed under the display panel DP. When the electronic module SS includes one of the light receiving module LRM or the camera module CMM, the external light is received by the electronic module SS after passing through the display panel DP. In this case, some components of the display panel DP, which overlap the electronic module SS, block external light. Thus, the electronic module SS has improved reliability is provided in an area of the display panel DP that has a relatively higher transmittance than an area that does not overlap the electronic module SS.

Accordingly, according to an embodiment, the first transmission portion LT1 that overlaps the electronic module SS is an area that has a relatively higher transmittance than the second transmission portion LT2 in the display panel DP. Therefore, the first transmission portion LI1 includes areas from which some components of the display panel DP are omitted.

According to an embodiment, as the first transmission portion LT1 includes areas from which some components of the display panel DP are omitted, the second transmission portion LT2 is a reflective compensation area that reduces a difference in reflectance between the second transmission portion LT2 and the first display area RA1.

Thus, according to an embodiment, the difference in reflectance between the first display area RA1 and the second transmission portion LT2 is less than the difference in reflectance between the first display area RA1 and the first transmission portion LT1. As the second transmission portion LT2 surrounds the first transmission portion LT1, the first transmission portion LT1 can be prevented from being externally viewed.

According to an embodiment of the present disclosure, since the light transmittance of the first transmission portion LT1 that overlaps the electronic module SS is relatively higher than that of the area adjacent thereto in the display panel DP, the performance of the electronic module SS is improved. In addition, as the second transmission portion LT2 surrounds the first transmission portion LT1, the first transmission portion LT1 is prevented from being viewed from the outside even when the display panel DP is black. Consequently, an electronic apparatus that has improved visibility is provided.

Referring to FIG. 4B, according to an embodiment, the display panel DP-A includes a first display area RA1-A and a second display area RA2-A. The second display area RA2-A includes a first transmission portion and a second transmission portion LT2-A. The first transmission portion LT1-A includes a first portion SA1 and a second portion SA2. The number of first portions SA1 and the number of second portions SA2 in the first transmission portion LT1-A can vary depending on the number of electronic modules SS disposed under the display panel DP-A. The first portion SA1 and the second portion SA2 may have a circular shape with different sizes, however embodiments are not limited thereto, and the first and second portions SA1 and SA2 may have different shapes, and may each have a different shape. That is, the first and second portions SA1 and SA2 may have a polygonal or oval shape and are not particularly limited.

According to an embodiment, the first display area RA1-A and the second display area RA2-A are arranged in the second direction DR2. In addition, the second display area RA2-A has a bar shape that extends in the first direction DR1.

FIG. 5A is an enlarged view of the first transmission portion LT1 shown in FIG. 4A for each adjacent pixel group. Descriptions below equally apply to the first transmission portion LT1-A shown in FIG. 4B.

Referring to FIG. 5A, according to an embodiment, the first transmission portion LT1 include light emitting areas PA and light transmitting areas TR1. The light emitting areas PA and the light transmitting areas TR1 are alternately arranged with each other, forming a checkerboard pattern. In a present exemplary embodiment, the light emitting areas PA and the light transmitting areas TR1 are shown as being the same size as each other, however, embodiments are not limited thereto, and in other embodiments, the sizes of emitting areas PA differs from the sizes of the light transmitting areas TR1. The transmittance of the first transmission portion LT1 varies according to a type of the display panel DP, and thus, a ratio of the light emitting areas PA to the light transmitting areas TR1 per unit area depends on the type of the display panel DP.

According to an embodiment, each of the light emitting areas PA corresponds to an area in which a light emitting pattern EL and a first electrode E1 of the pixels PX described below are disposed, and each of the light transmitting areas TR1 corresponds to an area in which the light emitting pattern EL and the first electrode E1 are not disposed.

FIG. 5B is a cross-sectional view of one light emitting area PA and one adjacent light transmitting area TR1.

According to an embodiment, the display module DM includes the display panel DP and the input sensing layer ISL. The input sensing layer ISL is disposed on the display panel DP.

According to an embodiment, the display panel DP includes a base substrate BL, a circuit element layer DP-CL, and a display element layer DP-OL. The circuit element layer DP-CL provide a signal to the light emitting diode OD included in the display element layer DP-OL to drive the light emitting diode OD. Each pixel PX includes the transistor T1 and the light emitting diode OD.

According to an embodiment, the base substrate BL is an insulating substrate. For example, the base substrate BL may be a plastic substrate or a glass substrate.

According to an embodiment, a first insulating layer 10 is disposed on the base substrate BL that covers an entire surface of the base substrate BL. The first insulating layer 10 includes an inorganic material. The first insulating layer 10 includes a barrier layer or a buffer layer. Accordingly, the first insulating layer 10 can prevent oxygen or moisture permeating through the base substrate BL from entering the pixel PX or can lower a surface energy of the base substrate BL such that components of the pixel PX are stably formed on the base substrate BL.

In a present exemplary embodiment, of the components of the pixel PX shown in FIG. 3, the transistor corresponding to the driving transistor T1 and the light emitting diode OD are shown as representative examples.

According to an embodiment, the transistor T1 is disposed on the first insulating layer 10. The transistor T1 includes a semiconductor pattern SL, a control electrode CE, an input electrode OE, and an output electrode IE. The semiconductor pattern SL is disposed on the first insulating layer 10. The semiconductor pattern SL includes a semiconductor material. The control electrode CE is spaced apart from the semiconductor pattern SL with a second insulating layer 20 interposed therebetween.

According to an embodiment, the input electrode OE and the output electrode IE are disposed on a third insulating layer 30 and are respectively connected to one side and the other side of the semiconductor pattern SL after penetrating through the second insulating layer 20 and the third insulating layer 30.

However, embodiments of the input electrode OE and the output electrode IE are not limited thereto. In other embodiments, the input electrode OE and the output electrode IE are disposed on the same layer as the semiconductor pattern SL and are provided integrally with the semiconductor pattern SL. For example, the input electrode OE may extend from one end of the semiconductor pattern SL, and the output electrode IE may extend from the other end of the semiconductor pattern SL. In this case, an area between the output electrode IE and the input electrode OE is a channel area. The transistor T1 according to an exemplary embodiment can have various stack structures and are not particularly limited.

According to an embodiment, a fourth insulating layer 40 is disposed on the third insulating layer 30 and covers the input electrode OE and the output electrode IE. The fourth insulating layer 40 may include an organic material or an inorganic material and may have a single-layer or multi-layer structure.

According to an embodiment, the light emitting diode OD includes the first electrode E1, a light emitting layer EL, and a second electrode E2. The first electrode E1 is disposed on the fourth insulating layer 40. The first electrode E1 is electrically connected to the transistor T1 after penetrating through the fourth insulating layer 40. In FIG. 5B, the first electrode E1 is directly connected to the transistor T1, however, according to another embodiment, the first electrode E1 is electrically connected to the transistor T1 via a second transistor T6 shown in FIG. 3.

According to an embodiment, a fifth insulating layer 50 is disposed on the fourth insulating layer 40. The fifth insulating layer 50 has a display opening D-OP defined therethrough, and at least a portion of the first electrode E1 is exposed through the display opening D-OP. The fifth insulating layer 50 is a pixel definition layer.

According to an embodiment, the display opening D-OP corresponds to a light emitting area of each pixel PX. FIG. 5B shows a first light emitting area PXA11 and a second light emitting area PXA22, which respectively correspond to two pixels. In a present exemplary embodiment, a group of the first light emitting area PXA11 and the second light emitting area PXA22 correspond to one of the light emitting areas PA shown in FIG. 5A.

According to an embodiment, an area between the first light emitting area PXA11 and the second light emitting area PXA22 is a non-light emitting area NPXA. The non-light emitting area NPXA overlaps an area of the pixel definition layer 50 outside of the display opening D-OP.

According to an embodiment, the light emitting pattern EL is disposed on portion of the first electrode E1 exposed through the display opening D-OP. The light emitting pattern E1 includes a light emitting material. The light emitting pattern EL includes a material that emitting one of red, green, or blue light. The light emitting pattern EL may include a fluorescent material or a phosphorescent material. The light emitting pattern EL may include an organic light emitting material or an inorganic light emitting material. The light emitting pattern EL emits light in response to an electric potential difference between the first electrode E1 and a second electrode E2.

According to an embodiment, the second electrode E2 is disposed on the light emitting pattern EL and the fifth insulating layer 50. The second electrode E2 includes a transmissive conductive material or a semi-transmissive conductive material. Accordingly, the light generated by the light emitting pattern EL can propagate in the third direction DR3 through the second electrode E2. The second electrode E2 may be commonly disposed over all of the pixels.

However, this is merely exemplary, and embodiments are not limited thereto. Depending on its design, the light emitting diode OD according to an exemplary embodiment of the present disclosure is a rear surface light emitting diode in which the first electrode E1 includes a transmissive or semi-transmissive material or a both surface light emitting diode in which the light is emitted to both of the front and rear surfaces, and is not limited to a specific embodiment.

In FIG. 5B, according to an embodiment, the second electrode E2 overlaps the light emitting area PA and does not overlap the light transmitting areas TR1, however, embodiments are not limited thereto. That is, the second electrode E2 may have an integral shape that extends from the active area AA to the peripheral area NAA.

According to an embodiment, an encapsulation layer ECL is disposed on the light emitting diode OD to encapsulate the light emitting diode OD. In addition, a capping layer is further disposed between the second electrode E2 and the encapsulation layer ECL to cover the second electrode E2.

According to an embodiment, the encapsulation layer ECL includes a first inorganic layer an organic layer OEL, and a second inorganic layer UIL, which are sequentially stacked in the third direction DR3, however embodiments are not limited thereto. In other embodiments, the encapsulation layer ECL further includes a plurality of inorganic layers and organic layers.

According to an embodiment, the first inorganic layer LIL covers the second electrode E2. The first inorganic layer LIL protects the light emitting diode OD from external moisture or oxygen. For example, the first inorganic layer LIL includes silicon nitride, silicon oxide, or a compound thereof. The first inorganic layer LIL is formed by a chemical vapor deposition process.

According to an embodiment, the organic layer OEL is disposed on the first inorganic layer LIL and makes contact with the first inorganic layer LIL. The organic layer OEL provides a flat surface on the first inorganic layer LIL. An uneven upper surface of the first inorganic layer LIL or particles present on the first inorganic layer LIL are covered by the organic layer OEL, and thus, an influence of the upper surface of the first inorganic layer LIL exerted on components formed on the organic layer OEL is blocked. In addition, the organic layer OEL relieves stress between layers that make contact with each other. The organic layer OEL includes an organic material and is formed by a solution process, such as a spin coating, a slit coating, or an inkjet process.

According to an embodiment, the second inorganic layer UIL is disposed on the organic layer OEL and covers the organic layer OEL. The second inorganic layer UIL is stably formed on the relatively flat surface of the organic layer OEL rather than being disposed on the first inorganic layer LIL. The second inorganic layer UIL encapsulates moisture that leaks from the organic layer OEL to prevent the moisture from leaking outside. The second inorganic layer UIL includes silicon nitride, silicon oxide, or a compound thereof. The second inorganic layer UIL is formed by a chemical vapor deposition process.

According to an embodiment, the input sensing layer ISL is disposed on the display panel DP. The input sensing layer ISL includes a plurality of conductive patterns CL1 and CL2 and a plurality of sensing insulating layers TIL1 and TIL2. A first conductive pattern CL1 is disposed on the encapsulation layer ECL. A first sensing insulating layer TIL1 covers the first conductive pattern CL1, however, embodiments are not limited thereto. In other embodiments, an additional insulating layer is further disposed between the first conductive pattern CL1 and the encapsulation layer ECL, and in this case, the first conductive pattern CL1 may be disposed on the additional insulating layer disposed on the encapsulation layer ECL.

According to an embodiment, the first sensing insulating layer TIL1 includes an inorganic material or an organic material. A second conductive pattern CL2 is disposed on the first sensing insulating layer TIL1. A second sensing insulating layer TIL2 covers the second conductive pattern CL2. The second sensing insulating layer TIL2 includes the same material as the first sensing insulating layer TIL1.

According to an embodiment, the first conductive pattern CL1 and the second conductive pattern CL2 form a sensing electrode of the input sensing layer ISL. The first conductive pattern CL1 and the second conductive pattern CL2 are connected to each other through the first sensing insulating layer TIL1.

According to an embodiment, the input sensing layer ISL senses the external input using a self-capacitance method or a mutual capacitance method. The first conductive pattern CL1 and the second conductive pattern CL2 can be variously modified, arranged, and connected according to the self-capacitance method or the mutual capacitance method.

According to an embodiment of the present disclosure, the conductive patterns CL1 and CL2 overlap the non-light emitting area NPXA and are spaced apart from the light emitting areas PXA11 and PXA22. Therefore, although the conductive patterns CL1 and CL2 are disposed on the display panel DP, interference of the conductive patterns CL1 and CL2 with the light generated by the pixel PX is minimized.

According to an embodiment of the present disclosure, the light transmitting area TR1 includes a plurality of transmitting areas TZ1 and TZ2. FIG. 5B shows two transmitting areas TZ1 and TZ2 as a representative example, however, embodiments are not limited thereto. The light transmitting area TR1 corresponds to the area in which the first electrode E1 and the light emitting pattern EL are not disposed.

According to an embodiment, the transmitting areas TZ1 and TZ2 overlap a transmission opening T-OP formed through the insulating layers in each of the circuit element layer DP-CL and the display element layer DP-OL.

For example, according to an embodiment, the transmission opening T-OP includes a first transmission opening TO1 and a second transmission opening TO2. The first transmission opening TO1 and the second transmission opening TO2 are aligned in the third direction DR3.

According to an embodiment, the first transmission opening TO1 is formed through the fourth insulating layer 40, and the second transmission opening TO2 is formed through the pixel definition layer 50. An area between the transmitting areas TZ1 and TZ2 is the non-light emitting area NPXA. The transmission opening T-OP is covered by the first inorganic layer LIL of the encapsulation layer ECL.

According to an embodiment, since the first electrode E1 and the light emitting pattern EL are not disposed in the light transmitting area TR1, the light transmitting area TR1 has a higher light transmittance than the light emitting area PA adjacent thereto. Thus, the electronic module SS according to an embodiment of the present disclosure can overlap the light transmitting area TR1.

FIG. 6A is an enlarged view of the second transmission portion LT2 shown in FIG. 4A for each adjacent pixel group. Descriptions below are equally applicable to the second transmission portion LT2-A shown in FIG. 4B. The circuit element layer DP-CL and the display element layer DP-OL shown in FIG. 6B have substantially the same configurations as those of the circuit element layer DP-CL and the display element layer DP-OL shown in FIG. 5B, and thus a repeated description is omitted.

Referring to FIG. 6A, according to an embodiment, the second transmission portion LT2 includes light emitting areas PA and reflective compensation areas TR2. The light emitting areas PA and the reflective compensation areas TR2 are alternately arranged with each other, and form a checkerboard pattern.

According to an embodiment, each of the light emitting areas PA corresponds to an area in which a light emitting pattern EL and a first pixel electrode E1 of one of the pixels PX are disposed, and each of the reflective compensation areas TR2 corresponds to an area in which the light emitting pattern EL is not disposed and a reflective compensation electrode ES is disposed.

According to an emibodiment, FIG. 6B shows a third light emitting area PXA33 and a fourth light emitting area PXA44, which respectively correspond to two pixels. In a present exemplary embodiment, a group of the third light emitting area PXA33 and the fourth light emitting area PXA44 corresponds to one of the light emitting areas PA shown in FIG. 6A.

According to an embodiment, the second transmission portion LT2 prevents the first transmission portion LT1 from being viewed from the outside due to reflectance differences between the first transmission portion LT1 and adjacent areas, since the first transmission portion LT1 includes the light transmitting areas TR1. The second transmission portion LT2 has a light transmittance that is less than that of the first transmission portion LT1, however, the reflectance differences between the second transmission portion LT2 and the first display area RA1 are less than the reflectance differences between the first transmission portion LT1 and the first display area RA1.

According to an embodiment of the present disclosure, the reflective compensation area TR2 includes a plurality of compensation areas EZ1 and EZ2. FIG. 6B shows two compensation areas EZ1 and EZ2 as a representative example, however, embodiments are not limited thereto.

According to an embodiment, the reflective compensation electrode ES is disposed on the fourth insulating layer 40 and is exposed through the display opening D-OP formed through the pixel definition layer 50. The reflective compensation electrode ES is covered by the first inorganic layer LIL. In addition, when the second electrode E2 is disposed on the entire surface of the base substrate BL, the second electrode E2 is disposed on the reflective compensation electrode ES.

According to an embodiment, the reflective compensation electrode ES is formed through the same process as the first electrode E1. That is, the reflective compensation electrode ES is formed by forming a conductive material or a metal material on the fourth insulating layer 40 and patterning the first electrode E1. Accordingly, the reflective compensation electrode ES and the first electrode E1 are formed on the same layer and include the same material.

In a present exemplary embodiment of the present disclosure, for convenience of explanation, electrodes respectively disposed in the light emitting area PA and the reflective compensation area TR2 are described as first electrodes E1 and reflective compensation electrodes ES, respectively, and the reflective compensation electrodes ES disposed in the reflective compensation area TR2 have substantially the same configuration as the first electrodes E1.

However, according to an embodiment, the reflective compensation electrode ES disposed in the reflective compensation area TR2 differs from the first electrode E1 disposed in the light emitting area PA in that the reflective compensation electrode ES is not connected to the transistor T1. Therefore, a signal provided from the transistor T1 is not transmitted to the reflective compensation electrode ES.

According to an embodiment, the reflective compensation electrode ES includes one of a first reflective compensation electrode ES1 that floats and a second reflective compensation electrode ES2 that receives a constant voltage.

According to an embodiment, the floated first reflective compensation electrode ES1 is electrically insulated from conductive layers adjacent thereto due to the insulating layers. The second reflective compensation electrode ES2 receives the same voltage as one of a voltage applied to the gate line, a voltage applied to the data line, or the initialization voltage Vint.

According to an embodiment of the present disclosure, the second transmission portion LT2 includes the reflective compensation electrode ES that includes the same material as the first electrode E1 included in the light emitting area PA, and thus, the second transmission portion LT2 compensates for the reflectance difference between the first transmission portion LT1 and the area including only the light emitting areas PA in the display panel DP.

According to an embodiment, the second transmission portion LT2 surrounds the first transmission portion LT1. In addition, the second transmission portion LT2 has an area greater than the first transmission portion LT1. Accordingly, the second transmission portion LT2 compensates for the reflectance differences between the first transmission portion LT1 and the first display area RA1, and thus, the first transmission portion LT1 is prevented from being externally visible.

FIG. 7 is an enlarged view of the first display area RA1 shown in FIG. 4A for each adjacent pixel group. Descriptions below are equally applicable to the first display area RA1-A shown in FIG. 4B.

The first display area RA1 according to an embodiment of the present disclosure includes only light emitting areas PA. Each of the light emitting areas PA has disposed therein the fast electrode E1 and the light emitting pattern EL of the pixel PX. The light emitting areas PA of FIG. 7 have the same configuration as the light emitting areas PA shown in FIGS. 5B and 6B.

According to an embodiment of the present disclosure, the electronic module SS overlaps the light transmitting areas TR1 and does not overlap the reflective compensation area TR2.

According to an embodiment of the present disclosure, the number of light emitting patterns EL disposed in the second display area RA2 per unit area is less than that the number in the first display area RA1, and the number of the light emitting patterns EL disposed in the first transmission portion LT1 per unit area is equal to the number in the second transmission portion LT2.

According to an embodiment of the present disclosure, as the display panel DP, which overlaps the electronic module SS, includes the first transmission portion LT1 that includes the light emitting areas PA and the light transmitting areas TR1, the performance of the electronic module SS is improved. In addition, as the display panel DP includes the second transmission portion LT2 that surrounds the first transmission portion LT1 and includes the light emitting areas PA and the reflective compensation areas TR2, reflectance differences between the first display area RA1, which includes only the light emitting areas PA, and the first transmission portion LT1 are compensated, and thus, the visibility of the electronic apparatus may be improved.

FIGS. 8A to 8F are enlarged views of a portion of each display panel according to an exemplary embodiment of the present disclosure. In FIGS. 8A to 8F, the same or similar reference numerals may denote the same or similar elements in FIGS. 1A to 7, and thus, details thereof will be omitted.

According to an embodiment of the present disclosure, the light emitting patterns EL and the first electrode E1 disposed in the light emitting areas PA, shown in FIGS. 5A, 6A, and 7, are arranged in a matrix-shaped reference arrangement. The reference arrangement shape of the first electrode E1 in the light emitting areas PA is substantially the same as an arrangement shape of the reflective compensation electrode ES disposed in the reflective compensation areas TR2. Accordingly, the electrodes disposed in the light emitting areas PA and the reflective compensation areas TR2 have the same arrangement as each other, and thus, visibility is improved.

Hereinafter, an arrangement shape of emitting areas shown in FIGS. 8A to 8F corresponds to a shape of the reflective compensation electrode disposed in each of the reflective compensation areas.

Figure 8A:
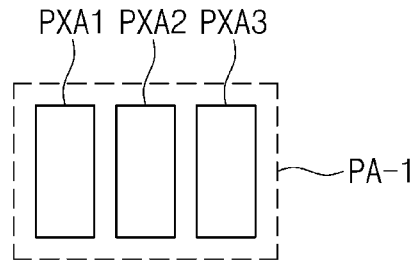
FIGS. 8A to 8F are enlarged views of a portion of a display panel according to an exemplary embodiment of the present disclosure.

Referring to FIG. 8A, according to an embodiment, a light emitting area PA-1 that defines a unit area includes a first light emitting area PXA1, a second light emitting area PXA2, and a third light emitting area PXA3.

According to an embodiment, the light emitting areas PXA1, PXA2, and PXA3 generate different light from each other.

According to an embodiment, the first light emitting area PXA1, fhe second light emitting area PXA2, and the third light emitting area PXA3 are arranged in one line along a predetetmined direction. The first light emitting area PXA1, the second light emitting area PXA2, and the third light emitting area PXA3 have the same size as each other and have a rectangular shape.

Figure 8B:
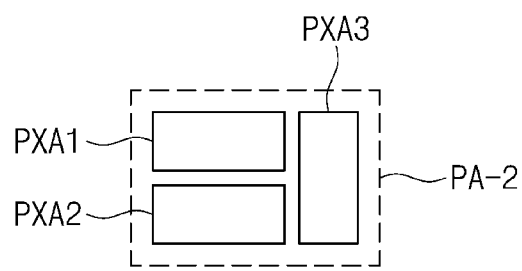

Referring to FIG. 8B, according to an embodiment, a light emitting area PA-2 that defines a unit area includes a first light emitting area PXA1, a second light emitting area PXA2, and a third light emitting area PXA3. Each of the first light emitting area PXA1, the second light emitting area PXA2, and the third light emitting area PXA3 has a rectangular shape. The first light emitting area PXA1 and the second light emitting area PXA2 extend in a horizontal direction, and the third light emitting area PXA3 extends in a vertical direction. The first light emitting area PXA1 and the second light emitting area PXA2 are arranged in the vertical direction, and the third light emitting area PXA3 is horizontally arranged with respect to the first light emitting area PXA1 and the second light emitting area PXA2.

According to an embodiment, FIGS. 8A and 8B show a structure in which one light emitting area PA-1 or PA-2 includes three light emitting areas as a representative example, however, embodiments of the present disclosure are not limited thereto. For example, in other embodiments, one light emitting area PA-1 or PA-2 may include one light emitting area, two light emitting areas, or four or more light emitting areas.

Figure 8C:
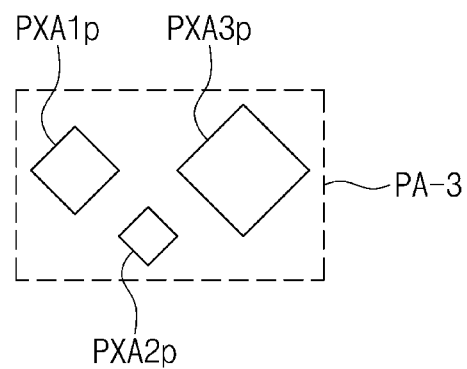

Referring to FIG. 8C, according to an embodiment, a light emitting area PA-3 that defines a unit area includes a first light emitting area PXA1$p$, a second light emitting area PXA2$p$, and a third light emitting area PXA3$p$. Each of the first light emitting area PXA1$p$, the second light emitting area PXA2$p$, and the third light emitting area PXA3$p$ may have a substantially rectangular lozenge shape. The first light emitting area PXA1$p$, the second light emitting area PXA2$p$, and the third light emitting area PXA3$p$ have different sizes from each other. The first light emitting area PXA1$p$ has a first size, the second light emitting area PXA2$p$ has a second size, and the third light emitting area PXA3$p$ has a third size. The first size is greater than the second size, and the third size is greater than the first size. The arrangement shown in FIG. 8C is called a pen-tile shape.

Figure 8D:
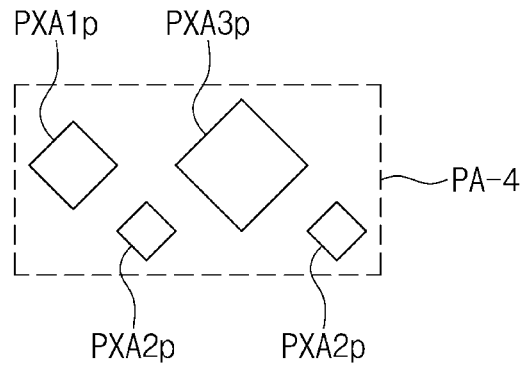

Referring to FIG. 8D, according to an embodiment, a light emitting area PA-4 that defines a unit area includes one more second light emitting area. PXA2$p$ when compared with the light emitting area PA-3 shown in FIG. 8C.

Figure 8E:
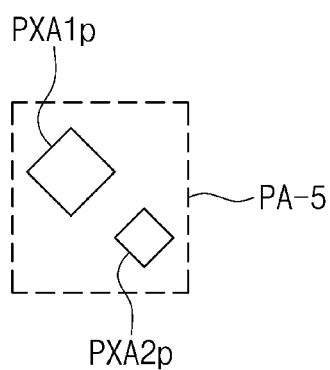

Referring to FIG. 8E, according to an embodiment, a light emitting area PA-5 that defines a unit area does not include the third light emitting area PXA3$p$.

Figure 8F:
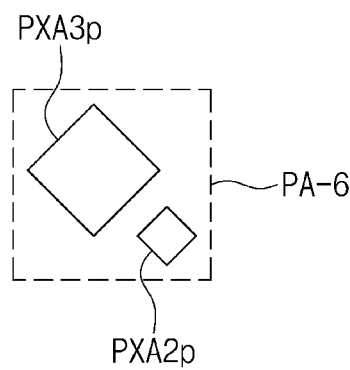

Referring to FIG. 8F, according to an embodiment, a light emitting area PA-6 that defines a unit area does not include the first light emitting area PXA1$p$.

According to embodiments of the present disclosure, the light emitting area PA shown in FIG. 5B is an area in which one of the light emitting areas PA-1 to PA-6 is provided, however, embodiments are not limited thereto. The light emitting area PA may include a plurality of the light emitting areas PA-1 to PA-6, however, embodiments are not particularly limited thereto.

Although exemplary embodiments of the present disclosure have been described, it is understood that embodiments of the present disclosure should not be limited to these exemplary embodiments but various changes and modifications can be made by one ordinary skilled in the art within the spirit and scope of the present disclosure as hereinafter claimed.

Therefore, the disclosed subject matter should not be limited to any single embodiment described herein, and the scope of the present inventive concept shall be determined according to the attached claims.

What is claimed is:

1. An electronic apparatus, comprising:
 a display panel that includes a circuit element layer that includes a plurality of transistors and a display element layer that includes first electrodes respectively connected to the transistors, a second electrode disposed on the first electrodes, a plurality of light emitting patterns each being disposed on a corresponding first electrode, and a plurality of reflective compensation electrodes spaced apart from the first electrodes, wherein the reflective compensation electrodes includes one of a first reflective compensation electrode that floats or a second reflective compensation electrode that receives a constant voltage,
 wherein the display panel further includes
  light emitting areas in which the light emitting patterns and the first electrodes are disposed, wherein the first electrode is an anode electrode of each light emitting area, and the light emitting pattern is a light emitting layer of each light emitting area;
  light transmitting areas in which the first electrodes and the light emitting patterns are not disposed and that includes transmission openings formed through a portion of the circuit element layer and the display element layer; and
  reflective compensation areas in which the reflective compensation electrodes are disposed, wherein the reflective compensation electrodes are formed directly on a top surface of a same layer as the first electrodes, when viewed in a cross sectional view, and wherein the light emitting areas, the light transmitting areas, and the reflective compensation areas are disjoint areas that do not overlap each other, when viewed in a plan view; and
 an electronic module disposed under the display panel, wherein the electronic module overlaps the light transmitting areas and is spaced apart from the reflective compensation areas.

2. The electronic apparatus of claim 1, wherein the display panel comprises:
 a first display area in which the light emitting areas are arranged in a first direction and a second direction that crosses the first direction; and
 a second display area that includes a first transmission portion that includes the light emitting areas and the light transmitting areas and a second transmission portion that includes the light emitting areas and the reflective compensation areas,
 wherein the electronic module overlaps the first transmission portion.

3. The electronic apparatus of claim 2, wherein a number of the light emitting patterns disposed in the second display area per unit area is less than a number of the light emitting patterns disposed in the first display area per unit area.

4. The electronic apparatus of claim 2, wherein a number of the light emitting patterns disposed in the first transmission portion per unit area is equal to a number of the light emitting patterns disposed in the second transmission portion per unit area.

5. The electronic apparatus of claim 2, wherein the second transmission portion extends in the first direction, and the first display area and the second display area are arranged in the second direction.

6. The electronic apparatus of claim 2, wherein the second transmission portion has an area greater than that of the first transmission portion.

7. The electronic apparatus of claim 1, wherein the circuit element layer includes a plurality of insulating layers, and the first electrodes and the reflective compensation electrodes are disposed on an insulating layer closest to the display element layer.

8. The electronic apparatus of claim 1, wherein the display element layer includes a pixel definition layer through which a plurality of openings are formed, and the first electrodes and the reflective compensation electrodes are exposed through the openings in the pixel definition layer, wherein the pixel definition layer covers edge portions of the first electrodes and the reflective compensation electrodes.

9. The electronic apparatus of claim 1, wherein the reflective compensation electrodes include a same material as the first electrodes.

10. The electronic apparatus of claim 1, wherein each of the transistors includes a semiconductor layer, a control electrode disposed on and insulated from the semiconductor layer, an input electrode insulated from the control electrode and connected to the semiconductor layer, and an output electrode insulated from the control electrode, spaced apart from the input electrode, and connected to the semiconductor layer, and the reflective compensation electrodes receive a same voltage as one of the control electrode, the input electrode, and the output electrode.

11. The electronic apparatus of claim 1, wherein the electronic module comprises at least one of an audio output module, a light emitting module, a light receiving module, or a camera module.

12. An electronic apparatus, comprising:
a display panel that includes a plurality of light emitting elements, each including a first electrode, a second electrode disposed on the first electrode, and a light emitting pattern disposed between the first electrode and the second electrode, and a pixel definition layer through which a plurality of openings are formed; and
an electronic module disposed under the display panel, wherein the display panel includes
a first display area that includes light emitting areas in which the light emitting patterns and the first electrodes are arranged in a matrix shape and that does not overlap the electronic module, and
a second display area that does not overlap and is disjoint from the first display area, wherein the second display area includes a first transmission portion that overlaps the electronic module and a second transmission portion that surrounds the first transmission portion, wherein the second transmission portion does not overlap and is disjoint from the first transmission portion when viewed in a plan view, wherein
the first transmission portion includes the light emitting areas and light transmitting areas in which the light emitting patterns and the first electrodes are not disposed, wherein the light emitting areas and the light transmitting areas are disjoint areas that do not overlap each other and are arranged in a checkerboard pattern in which the light emitting areas and the light transmitting areas alternate with each other in a first direction and a second direction that crosses the first direction, when viewed in a plan view, and
the second transmission portion includes the light emitting areas and reflective compensation areas in which the light emitting patterns are not disposed and reflective compensation electrodes are disposed, wherein the light emitting areas and the reflective compensation areas are disjoint areas that do not overlap each other and are arranged in a checkerboard pattern in which the light emitting areas and the reflective compensation areas alternate with each other in a first direction and a second direction that crosses the first direction, when viewed in a plan view,
wherein the first electrode and the reflective compensation electrodes are exposed through the openings in the pixel definition layer and the pixel definition layer covers edge portions of the first electrode and the reflective compensation electrodes, and
wherein the electronic module overlaps the first transmission portion.

13. The electronic apparatus of claim 12, wherein a number of the light emitting patterns disposed in the second display area per unit area is less than a number of the light emitting patterns disposed in the first display area per unit area.

14. The electronic apparatus of claim 13, wherein a number of the light emitting patterns disposed in the first transmission portion per unit area is equal to a number of the light emitting patterns disposed in the second transmission portion per unit area.

15. The electronic apparatus of claim 14, wherein each of the light emitting areas includes at least one of a first light emitting area, a second light emitting area, or a third light emitting area, which generate different light from each other.

16. The electronic apparatus of claim 15, wherein at least two light emitting areas of the first, second, and third light emitting areas are arranged in a predetermined direction.

17. The electronic apparatus of claim 15, wherein at least two light emitting areas of the first, second, and third light emitting areas have different sizes from each other.

18. The electronic apparatus of claim 15, wherein at least one light emitting area of the light emitting areas further comprises a light emitting area that generates a same light as one of the first, second, or third light emitting areas.

19. The electronic apparatus of claim 12, wherein the second transmission portion has an area greater than that of the first transmission portion.

20. The electronic apparatus of claim 12, wherein the electronic module includes at least one of an audio output module, a light emitting module, a light receiving module, or a camera module.

* * * * *